(12) United States Patent
Shigemura

(10) Patent No.: US 6,191,669 B1
(45) Date of Patent: Feb. 20, 2001

(54) LAMINATED FILTER

(75) Inventor: Hiroshi Shigemura, Kyoto (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/233,512

(22) Filed: Jan. 20, 1999

(30) Foreign Application Priority Data

Jan. 20, 1998 (JP) .................................................. 10-008313

(51) Int. Cl.[7] .................................................. H01P 1/203
(52) U.S. Cl. ........................... 333/204; 333/219; 333/185
(58) Field of Search .................................. 333/204, 219, 333/185

(56) References Cited

U.S. PATENT DOCUMENTS 5,448,209 * 9/1995 Hirai et al. ........................... 333/204
5,892,415 * 4/1999 Okamura ............................. 333/175

FOREIGN PATENT DOCUMENTS

641035 * 3/1995 (EP) ..................................... 333/204

* cited by examiner

*Primary Examiner*—Benny Lee
*Assistant Examiner*—Stephen E. Jones
(74) *Attorney, Agent, or Firm*—Ratner & Prestia

(57) ABSTRACT

A laminated filter comprising a laminated body created by laminating a plurality of dielectric sheets, a resonator electrode disposed on an inner part of the laminated body, and an input-output electrode disposed on the inner part of the laminated body at a position facing the resonator electrode through the dielectric sheet. A stub electrode is connected to the input-output electrode.

4 Claims, 2 Drawing Sheets

LAMINATED FILTER

FIELD OF THE INVENTION

The present invention relates to the field of laminated filters used for products such as communications equipment.

BACKGROUND OF THE INVENTION

In general, laminated filters are configured by providing resonator electrodes in parallel on an inner layer within a stack of several laminated dielectric sheets, and an I/O electrode at a position facing the resonator electrodes through this inner layer of the dielectric sheets.

To improve the frequency characteristics of laminated filters, another resonator electrode and capacitance are connected in series to form a resonator electrode for notching, and connected to the laminated filter. This resonator electrode for notching generates an attenuation pole within the frequency characteristics, steepening the frequency characteristics curve.

However, when a resonator electrode for notching is provided within a laminated filter, in addition to the resonator electrodes, additional space is desirable for a) the resonator electrode for notching and b) an electrode for providing capacitance. Thus, it is difficult to produce laminated filters of a reduced size.

SUMMARY OF THE INVENTION

A laminated filter of the present invention comprises a laminated body created by laminating a plurality of dielectric sheets, a plurality of resonator electrodes disposed on the same layer within an inner part of the laminated body, and a first input-output electrode disposed on the inner part of the laminated body at a position facing one of the resonator electrodes for input through the dielectric sheet, a second input-output electrode disposed on the inner part of the laminated body at a position facing one of the resonator electrodes for output through the dielectric sheet. One end of at least one of the first and second input-output electrodes is connected to a stub electrode which has one open10 circuit end.

By connecting the stub electrodes to the I/O electrodes, a large attenuation is achieved and, at the same time, the size of the laminated filter can be reduced.

DESCRIPTION OF PREFERRED EMBODIMENT

A laminated filter in a preferred embodiment of the present invention is explained with reference to FIGS. 1 to 4.

Figure 1:
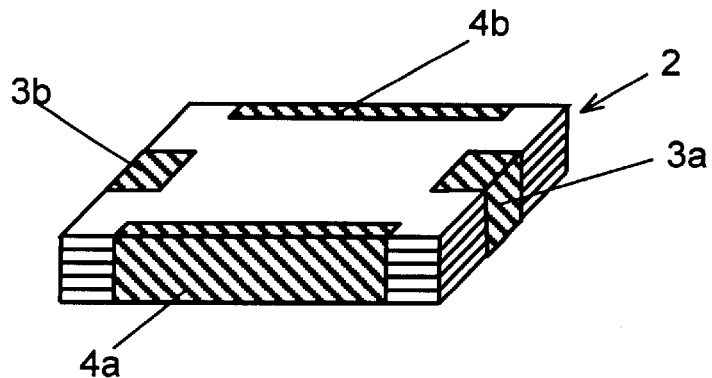
FIG. 1 is a perspective view of a laminated filter in accordance with a preferred embodiment of the present invention.
Figure 2:
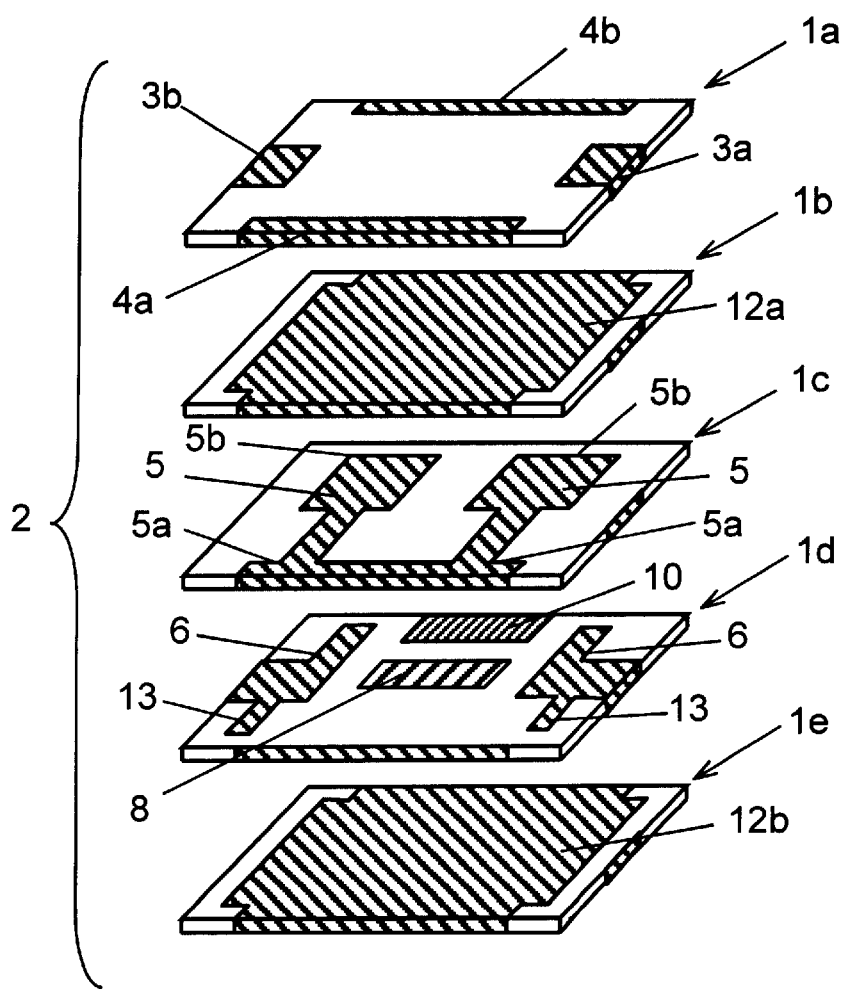
FIG. 2 is an exploded perspective view of the laminated filter in accordance with the preferred embodiment of the present invention.
Figure 3:
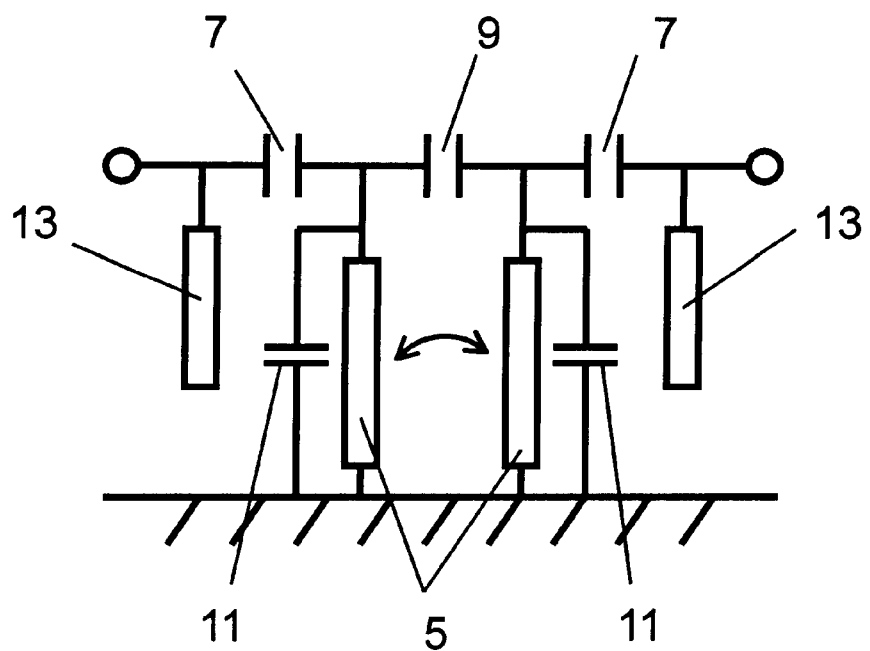
FIG. 3 is an equivalent circuit of the laminated filter in accordance with the preferred embodiment of the present invention.
Figure 4:
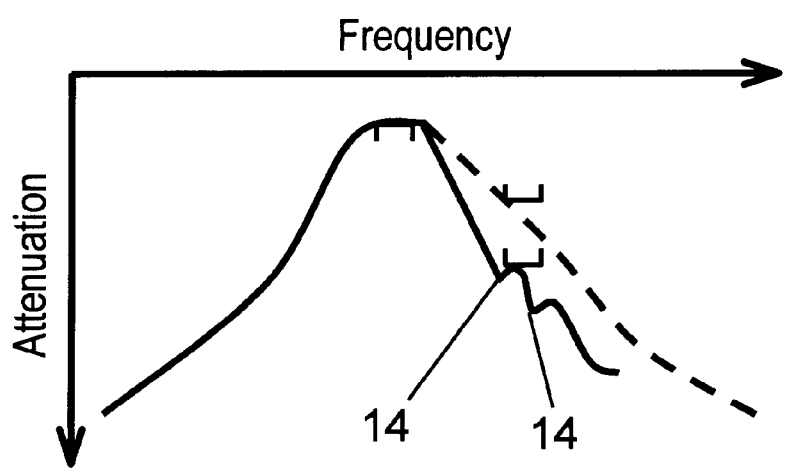
FIG. 4 shows the frequency characteristics of the laminated filter in accordance with the preferred embodiment of the present invention.

As shown in FIG. 2, dielectric sheets 1a to 1e are made of generally rectangular ceramic dielectric sheets but other shapes may be used. These dielectric sheets 1a to 1e are laminated together to form laminated body 2 including a plurality of inner dielectric sheets 1b, 1c and 1d forming an inner part. Input-output (I/O) terminals 3a and 3b and ground terminals 4a and 4b are disposed, as shown in FIG. 1, at the side faces of the laminated body 2. In the preferred embodiment as shown in FIG. 2, the I/O terminals 3a and 3b are disposed on opposed side faces.

One of two resonator electrodes 5 forms part of an input resonance circuit, and the other forms part of an output resonance circuit. These two resonator electrodes 5 are disposed on dielectric sheet 1c. For each resonator electrode 5, one end is connected to the ground terminal 4a, forming a short-circuit end 5a, and the other end extends towards ground terminal 4b and forms an open-circuit end 5b.

Input-output (I/O) electrodes 6 are disposed on dielectric sheet 1d. One end of each I/O electrode 6 is connected to a corresponding I/O terminal 3a or 3b. The other end of each I/O electrode 6 is located at a position facing the open-circuit end 5b of one of the resonator electrodes 5 for input and output through the dielectric sheet 1c, forming input-output (I/O) capacitance 7 shown in FIG. 3.

A coupling electrode 8 is disposed on dielectric sheet 1d. Coupling electrode 8 is disposed facing portions of both resonator electrodes 5 which are placed side by side, and through the dielectric sheet 1c, creating an inter-stage coupling capacitance 9 shown in FIG. 3.

A frequency compression electrode 10 is disposed on the dielectric sheet 1d. One end of the frequency compression electrode 10 is connected to the ground terminal 4b, and the other end is disposed at a position facing the open-circuit end 5b of the resonator electrode 5 through the dielectric sheet 1c, creating a loading capacitance 11 shown in FIG. 3.

Shielding electrode 12a is disposed on dielectric sheet 1b on top of the dielectric sheet 1c and shielding electrode 12d is disposed on the dielectric sheet 1e underneath the dielectric sheet 1d, respectively. Shielding electrodes 12a and 12b are respectively connected to the ground terminals 4a and 4b. The purpose of these shielding electrodes 12a and 12b on the upper face of the topmost inner layer and the bottom layer of the laminated filter is to vertically sandwich the components of a filter circuit disposed on an inner part of the laminated body 2, i.e., the resonator electrodes 5, I/O electrodes 6, frequency compression electrode 10, stub electrode or electrodes 13, and coupling electrode 8; so as to improve the shielding capability of the laminated filter.

Each stub electrode 13 includes a strip disposed on the dielectric sheet 1d at a position which does not overlap any portion of the resonator electrode 5 through the dielectric sheet 1c. One end of each stub electrode 13 is connected to an I/O electrode 6, and the other end is an open-circuit end.

Each stub electrode 13 is a ¼-wavelength strip line. When the frequency of signals input to the stub electrode 13 is a resonance frequency, impedance at the open-circuit end becomes 0. In other words, when the signals input to the laminated filter coincide with the resonance frequency, these signals are short-circuited, generating attenuation pole 14 within the frequency characteristics as shown in the attenuation—frequency curve shown in FIG. 4.

Consequently, a resonator electrode for notching normally used for generating an attenuation pole in a laminated filter of the prior art can be eliminated. This means that of the space required for an electrode used to form capacitance is not needed. Thus, the laminated filter of the present invention can be made smaller. In addition, the laminated filter demonstrates high performance.

As above, one end of each stub electrode 13 is connected to an I/O electrode 6, and the other end is extended toward the short-circuit end 5a of the resonator electrode 5. If, however, the stub electrode 13 were to extend toward the open-circuit end 5b of a corresponding resonator electrode 5 and were disposed facing resonator electrode 5 across dielectric sheet 1c, the stub electrode 13 would form a capacitance coupling with the resonator electrode 5 across dielectric sheet 1c because the open-circuit end 5b of the resonator electrode 5 has a strong capacitance coupling capability. This will prevent generation of the attenuation pole 14 shown in FIG. 4, resulting in the formation of only I/O capacitance 7 shown in FIG. 3.

Thus, the laminated filter of the present invention secures a larger attenuation and prevents capacitance coupling between the stub electrode and the resonator electrode by connecting the stub electrode to the I/O electrode. Accordingly, the present invention enables the required frequency characteristics to be achieved and also provides for a smaller-sized laminated filter.

The preferred embodiment of the present invention is explained in details with reference to the case when a dielectric sheet on which a resonator electrode is formed and a dielectric sheet on which an I/O electrode is formed are laminated adjacent each other. The invention may be practiced or embodied in still other combinations. For example, another dielectric sheet may be disposed between these two dielectric sheets (which are dielectric sheets shown as sheets 1c and 1d as shown in FIG. 2). The essential characteristic of the invention is that the resonator electrode and I/O electrode are facing each other through a dielectric sheet or sheets. The preferred embodiment described herein is therefore illustrative and not restrictive. The scope of the invention is indicated by the appended claims and all modifications which come within the true spirit of the claims are intended to be embraced therein.

What is claimed is:

1. A laminated filter comprising:
    a laminated body created by laminating a plurality of dielectric sheets together;
    plurality of resonator electrodes disposed on a first of said plurality of inner dielectric sheets, and including an input resonator electrode and an output resonator electrode;
    a first input-output electrode disposed on a second of said plurality of dielectric sheets; and
    a second input-output electrode disposed on said second of said dielectric sheets, said second of said sheets disposed parallel to said first of said dielectric sheets;
    wherein said first input-output electrode is disposed facing said input resonator electrode, said second input-output electrode is disposed facing said output resonator electrode, and at least one of said first and second input-output electrodes is coupled to a stub electrode disposed on said second of said dielectric sheets and having an open-circuit end, and
    said stub electrode is disposed at a position not overlapping said resonator electrodes.

2. The laminated filter as in claim 1 further comprising first and second ground terminals disposed at opposing side faces of said laminated body and each resonator electrode having a further open circuit end and a short circuit end; wherein
    each of said short-circuit ends is coupled to said first ground terminal;
    each of said further open-circuit ends extends towards said second ground terminal; and
    said further open-circuit end of each stub electrode extends towards said first ground terminal.

3. The laminated filter as in claim 1 further comprising:
    a coupling electrode disposed on said second of said dielectric sheets, said coupling electrode disposed facing portions of each of said resonator electrodes disposed side by side on said first of said dielectric sheets; and
    a duality of shielding electrodes, each shielding electrode disposed within said laminated filter, and vertically sandwiching said resonator electrodes, said first and second input-output electrodes, said at least one stub electrode, and said coupling electrode;
    each of said shielding electrodes being coupled to each of said first and said second ground terminals.

4. The laminated filter as in claim 1, wherein said second of said dielectric sheets is disposed beneath said first of said dielectric sheets.

* * * * *